United States Patent [19]
Becke et al.

[11] Patent Number: 4,691,220
[45] Date of Patent: Sep. 1, 1987

[54] RADIAL HIGH VOLTAGE BIDIRECTIONAL SWITCH STRUCTURE WITH CONCAVO-CONCAVE SHAPED SEMICONDUCTOR REGIONS

[75] Inventors: Hans W. Becke, Morristown; Robert K. Smith, New Providence, both of N.J.

[73] Assignee: American Telephone and Telegraph Company, AT&T Bell Laboratories, Murray Hill, N.J.

[21] Appl. No.: 804,235

[22] Filed: Dec. 3, 1985

Related U.S. Application Data

[63] Continuation of Ser. No. 540,159, Oct. 7, 1983, abandoned.

[51] Int. Cl.[4] ............................................. H01L 29/747
[52] U.S. Cl. ..................................... 357/39; 357/20; 357/22; 357/58; 357/68
[58] Field of Search .................. 357/20, 35, 36, 38, 357/39, 86, 68, 22, 58

[56] References Cited

U.S. PATENT DOCUMENTS

| | | | |
|---|---|---|---|
| 3,832,732 | 8/1974 | Roberts | 357/35 |
| 3,968,512 | 7/1976 | Voss | 357/36 |
| 3,988,759 | 10/1976 | Denning et al. | 357/36 |
| 4,250,429 | 2/1981 | Davis et al. | 357/38 |
| 4,309,715 | 1/1982 | MacPherson et al. | 357/39 |
| 4,319,257 | 3/1982 | Beasom | 357/35 |
| 4,322,767 | 3/1982 | El Hamamsy et al. | 357/39 |
| 4,345,163 | 8/1982 | Davis et al. | 357/38 |
| 4,376,286 | 3/1983 | Lidow et al. | 357/23.4 |

OTHER PUBLICATIONS

S. Sze, "Physics of Semiconductor Devices," QC 612,S4S9, ©1969 John Wiley & Sons, Inc., p. 85.

*Primary Examiner*—Joseph E. Clawson, Jr.
*Attorney, Agent, or Firm*—David I. Caplan

[57] ABSTRACT

An improved radial type high voltage solid-state switch is essentially a gated diode switch (GDS) having two anode regions, two gate regions, a common cathode region, and a common shield region. The anodes, gates, cathode, and shield all have sides which are portions of concentric circles. The arc lengths and radii of the anode regions are less than the corresponding arc sides of the shield and cathode. This structure, which is a dual radial gated diode swtich (DRGDS), has lower on resistance than a conventional radial gated diode switch which has the same operating voltage range.

13 Claims, 5 Drawing Figures

RADIAL HIGH VOLTAGE BIDIRECTIONAL SWITCH STRUCTURE WITH CONCAVO-CONCAVE SHAPED SEMICONDUCTOR REGIONS

This application is a continuation of application Ser. No. 540,159, filed Oct. 7, 1983, now abandoned.

TECHNICAL FIELD

This invention relates to high voltage switches and, in particular, to solid-state high voltage switches having relatively low on resistance.

BACKGROUND OF THE INVENTION

High voltage solid-state switches, such as the gated diode switch (GDS) and the thyristor, which are both essentially p-i-n diodes, when in the on and conducting state, are characterized by dual carrier injection and typically use a shield region around the n cathode in order to increase the operating voltage range. Typically, the anode and cathode regions of the GDS have a rectangular shape, as does the shield region surrounding the cathode. The on resistance of the gated diode switch, though relatively low, is still not as low as is desirable in some applications. One contributing cause to the on resistance of the GDS is that the emitting efficiency of the cathode is significantly below that of the anode because of the shield region.

The radial gated diode switch (RGDS), which is described in copending U.S. patent application, Ser. No. 448,631, now U.S. Pat. No. 4,573,065 filed Dec. 10, 1982, and having a common assignee with the present application and two common inventors, uses anode, cathode, shield, and gate regions which each have a side portion that is an arc of one of a plurality of concentric circles. The RGDS has less on resistance that a conventional GDS of the same area.

In some applications, even lower on resistance than that of the above-described RGDS is desirable.

SUMMARY OF THE INVENTION

One embodiment of the present invention is a structure comprising a semiconductor body having a bulk portion. Within the semiconductor body are first and third regions of one conductivity type and a second region of the opposite conductivity type. The first, second, and third regions are of relatively low resistivity compared to the bulk portion of the semiconductor body. The structure is adapted to selectively facilitate or substantially inhibit current flow between the first and second regions and between the third and second regions. The first region has a first perimeter profile (arc portion) which faces a first perimeter profile (arc portion) of the second region, with the length of the second region first arc portion being greater than the length of the first region perimeter profile. The third region has a first perimeter profile (arc portion) which faces a second perimeter profile (arc portion) of the second region, with the length of the second region second arc portion being greater than the length of the third region first arc portion. The perimeter profiles which face each other each consist of a curve which may be a regular curve or which may have undulations about a regular curve or which may be a piecewise continuous curve. The first and third regions are electrically coupled together and are connectable to a first electrode. The second region is connectable to a second electrode. The first and second regions are separated from each other by an approximate constant distance, with there being a preselected minimum distance between the closest adjacent portions of the perimeters of the first and second regions which face each other. The third and second regions are separated from each other by an approximate constant distance, with there being a preselected minimum distance between the closest adjacent portions of the arcs of the second and third regions which face each other.

In a preferred embodiment, the structure further comprises a fourth region which is of the opposite conductivity type and surrounds the second region so as to separate from the bulk portion of the semiconductor body, and still further comprises fifth and sixth regions which each contact the semiconductor body and are electrically coupled together and are connectable to a third electrode. All of the perimeter profiles are arcs of concentric circles with the structure being an improved type radial gated diode switch (RGDS), with the first and third regions being anodes, the second region being a cathode, the fourth region being a shield, and the fifth and sixth regions being gates.

The structure of the present invention provides lower on resistance when it functions as a switch than the conventional radial gated diode switch type structure. This structure allows for favorable trade-offs between silicon area and on resistance.

These and other novel features and advantages of the present invention are better understood from consideration of the following detailed description taken in conjunction with the accompanying drawings.

DETAILED DESCRIPTION

Figure 1:
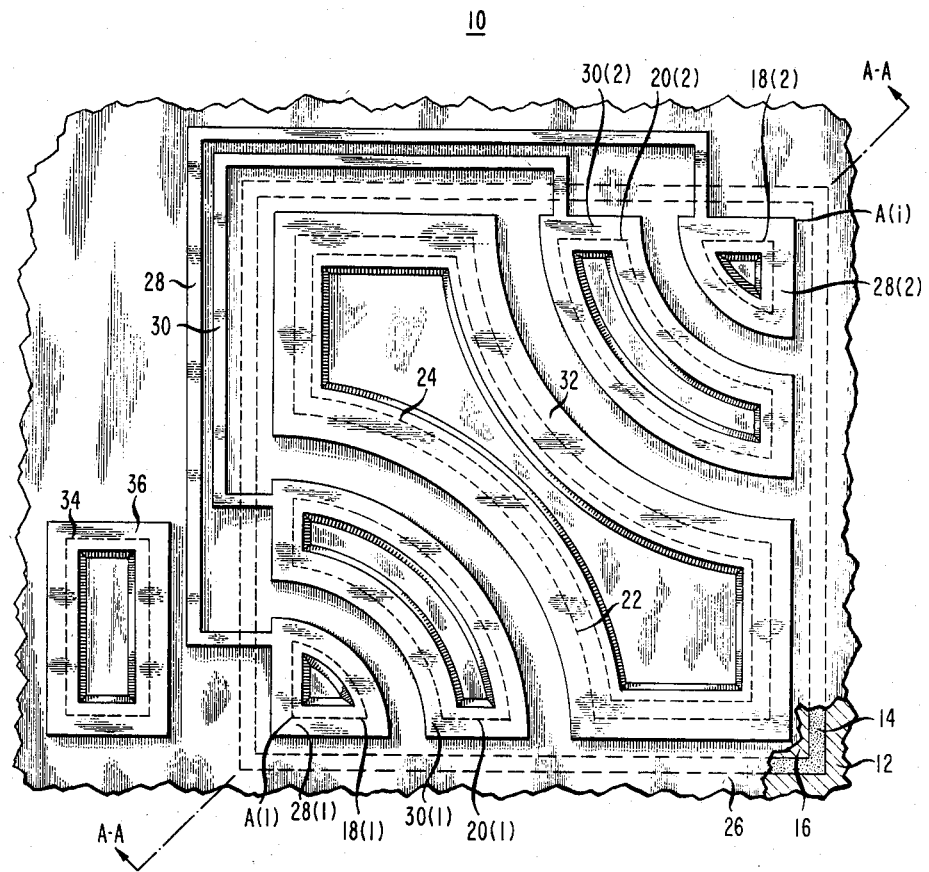
FIGS. 1 and 2 illustrate a top view and a cross-sectional view through line A—A of the top view, respectively, of a structure in accordance with one embodiment of the invention.
Figure 2:
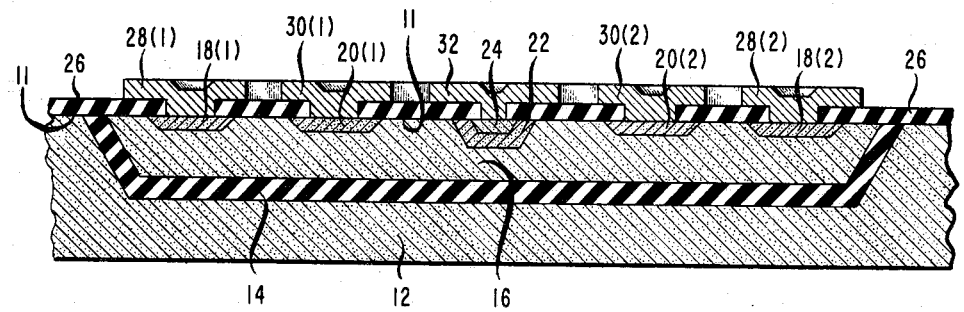

Referring now to FIGS. 1 and 2, there is illustrated a top view and a cross-sectional view taken along line A—A of the top view of a structure 10 comprising a support member 12 having a major surface 11 and a semiconductor body 16 whose bulk is of one conductivity type and which is separated from support member 12 by an insulator layer 14, which is typically a dielectric layer. The semiconductor body 16 has a portion that is common with surface 11. Structure 10 can be operated as a gated diode switch (GDS) and is a type of radial gated diode switch (RGDS).

Separate localized first and second anode regions 18(1) and 18(2), which are of the one type conductivity, are included in body 16 and each has a portion thereof that extends to surface 11. Separate localized first and second gate regions 20(1) and 20(2), which are of the opposite conductivity, are included in body 16, and each has a portion thereof which extends to surface 11. A localized cathode region 24, which is of the opposite type conductivity, is included in body 16 and has a portion which extends to surface 11. A region 22, which is of the one type conductivity and has a portion which extends to surface 11, surrounds region 24 and acts as a depletion layer punch-through shield. Region 22 separates cathode region 24 from the bulk portion of semiconductor body 16. In addition, it acts to inhibit inversion of the portions of body 16 at or near surface 11 between gate regions 20(1) and 20(2) and cathode region 24. It also acts to increase the voltage blocking capability between gate regions 20(1) and 20(2) and cathode region 24. Gate region 20(1) exists between anode region 18(1) and region 22 and is separated from both by bulk portions of body 16. Gate region 20(2) exists between the region 18(2) and region 22 and is separated from both by bulk portions of body 16. The resistivities of regions 18(1), 18(2), 20(1), 20(2), and 24 are low compared to that of the bulk portions of body 16. The resistivity of region 22 is intermediate between that of anode regions 18(1) and 18(2) and that of the bulk portions of body 16.

Electrodes 28(1), 28(2), 30(1), 30(2), and 32 are conductors which make low resistance contact to the surface portions of regions 18(1), 18(2), 20(1), 20(2), and 24, respectively. A dielectric layer 26 covers major surface 11 so as to isolate electrodes 28(1), 28(2), 30(1), 30(2), and 32 from all regions other than those intended to be electrically contacted. An electrode 36 provides a low resistance contact to support 12 by way of a highly doped region 34 which is of the same conductivity type as support 12. Electrodes 28(1) and 28(2) are electrically coupled together by conductor 28. Electrodes 20(1) and 20(2) are electrically coupled together by conductor 20.

Advantageously, the support 12 and the body 16 are each of silicon, and the support 12 may be either of n or p type conductivity. Each of electrodes 28(1), 28(2), 30(1), 30(2), and 32 advantageously overlaps the semiconductor region to which they make low resistance contact. Electrode 32 also overlaps region 22. This overlapping, which is known as field plating, facilitates high voltage operation because it increases the voltage at which breakdown occurs.

In one illustrative preferred embodiment, substrate 12, body 16, and regions 18(1), 18(2), 20(1), 20(2), 22, 24, and 34 are of n, p−, p+, p+, n+, n+, p, n+, and n+ type conductivity, respectively. Typical impurity concentrations for substrate 12, body 16, and regions 18(1), 18(2), 20(1), 20(2), 22, 24, and 34 are $5 \times 10^{13}$, $10^{19}$, $10^{19}$, $10^{19}$, $10^{19}$, $10^{17}-5 \times 10^{18}$, $10^{19}$, and $10^{19}$ impurities/cm$^3$, respectively. Dielectric layer 14 is silicon dioxide, and electrodes 28(1), 28(2), 30(1), 30(2), 32, and 36 are all aluminum as are conductors 20 and 28. In another embodiment, the conductivity of the substrate, body 16, and the regions are the opposite as in the preferred embodiment.

A plurality of separate bodies 16 can be formed in a common support 12 to provide a plurality of switches.

Structure 10 is typically operated as a switch which is characterized by a low impedance path between anode regions 18(1) and 18(2) and cathode region 24 when in the on state, and as a high impedance between said regions when in the off (blocking) state. The type of structure described herein is denoted as radial gated diode switch (RGDS). Substrate 12 is typically held at the most positive potential level available when body 16 is of p− type conductivity. It is held at the most negative potential level available when body 16 is of n− type conductivity. With operating potentials applied to the regions 18(1), 18(2), and 24, the potential applied to gate regions 20(1) and 20(2) determines the state of the switch. Regions 18(1) and 18(2) serve as anode regions, and region 24 serves as the cathode region when semiconductor body 16 is of p− type conductivity. Regions 18(1) and 18(2) serve as cathode regions, and region 24 serves as the anode region when semiconductor body 16 is of n− type conductivity.

With body 16 being of p− type conductivity, conduction between anode regions 18(1) and 18(2) and cathode region 24 is inhibited or interrupted (cut off) if the potential of gate regions 20(1) and 20(2) is sufficiently more positive than that of anode regions 18(1) and 18(2), cathode region 24, and region 22. The amount of excess positive potential needed to inhibit or interrupt (cut off) conduction is a function of the geometry and impurity concentration (doping) levels of structure 10. This positive gate potential causes vertical cross-sectional portions of body 16 between gate regions 20(1) and 20(2) and the portion of dielectric layer 14 therebelow to be depleted and the potential of these portions of body 16 to be greater in magnitude than that of anode regions 18(1) and 18(2), cathode region 24, and region 22. This essentially pinches off body 16 against dielectric layer 14 in the bulk portion thereof below gate regions 20(1) and 20(2) and extending down to dielectric layer 14. The positive potential barrier of the aforesaid portion of body 16 is a potential which inhibits conduction of holes from anode regions 18(1) and 18(2) to cathode region 24. If conduction exists between anode regions 18(1) and 18(2) and cathode region 24 before the potential of the gate regions 20(1) and 20(2) is raised to the high potential level, then gate regions 20(1) and 20(2) serve to collect electrons emitted at cathode region 24 before they can reach anode regions 18(1) and 18(2). This serves to help interrupt conduction between anode regions 18(1) and 18(2) and cathode region 24. In addition, the high level potential of gate regions 20(1) and 20(2) serves to cause vertical cross-sectional portions of body 16 between gate regions 20(1) and 20(2) and the portion of dielectric layer 14 therebelow to be depleted and the potential of this portion of body 16 to be greater in magnitude than that of anode regions 18(1) and 18(2), cathode region 24, and region 22. The blocking (essentially nonconducting) state is the off state. The geometry and impurity concentrations of structure 10 are designed to help inhibit or interrupt current flow between anode regions 18(1) and 18(2) and cathode region 24.

The voltage applied to semiconductor support 12 causes an electric field which extends through dielectric layer 14 and into semiconductor body 16. Normally, during the on state, electrons coat the bottom of semiconductor body 16 and act to shield it from the effect of the positive bias applied to substrate 12. With structure 10 biased to the off state, these electrons are removed from the bottom of semiconductor body 16 and drawn into gate region 20. This field tends to cause depletion of semiconductor body 16 and also helps cause the potential of the portion of the bulk portion of body 16 between gate regions 20(1) and 20(2) and extending down to dielectric layer 14 to be greater in potential than anode regions 18(1) and 18(2). The biased substrate 12 thus acts as a second or back gate which aids in switching structure 10 to the off state. Control circuitry capable of supplying the needed gate potentials and absorbing the electrons is illustrated and described in U.S. patent application Ser. No. 248,206, now abandoned (A. R. Hartman-T. J. Riley-P. W. Shackle Case 27-20-32), filed Mar. 27, 1981, and which has a common assignee.

With semiconductor body 16 being of p− type conductivity, conduction from anode regions 18(1) and 18(2) to cathode region 24 occurs if regions 18(1) and 18(2) are forward-biased with respect to region 24, and the potential of gate regions 20(1) and 20(2) is below a level which inhibits or interrupts conduction between anode regions 18(1) and 18(2) and cathode region 24. During the on state, holes are injected into body 16 from anode regions 18(1) and 18(2), and electrons are injected into body 16 from cathode region 24. These holes and electrons can be in sufficient numbers to form a plasma which conductivity modulates body 16. This effectively lowers the resistance of body 16 such that the resistance between anode region 18 and cathode region 24 is relatively low when structure 10 is operating in the on state. This type of operation is denoted as dual carrier injection. Positively biased substrate 12 creates an electrical field which passes through the dielectric layer 14 and tends to deplete the bulk portion of body 16. Electrons emitted from cathode region 24 coat the bottom of body 16 and thus act to shield the effect of the electrical field created by biased substrate 12. These electrons invert the bottom of the bulk portion of body 16 which is adjacent dielectric layer 14. This limits the effect of biased substrate 12 and thus allows conduction between anode region 18 and cathode region 24.

Region 22 helps limit the punch-through of a depletion layer formed during operation between gate regions 20(1) and 20(2) and cathode region 24 and helps inhibit formation of a surface inversion layer between these two regions. In addition, it facilitates gate regions 20(1) and 20(2) and cathode region 24 being relatively closely spaced apart. This facilitates relatively low resistance between anode regions 18(1) and 18(2) and cathode region 24 during the on state. It also serves to increase maximum operating voltage and to reduce leakage currents.

During the on state of structure 10, the junction diodes comprising semiconductor body 16 and gate regions 20(1) and 20(2) can become forward-biased. Current limiting means (not illustrated) are normally included to limit the conduction through the forward-biased diode. One example of such current limiting means is illustrated and described in U.S. patent application Ser. No. 248,206, now abandoned (A. R. Hartman-T. J. Riley-P. W. Shackle Case 27-20-32), filed Mar. 27, 1981, and having a common assignee.

The on state can be achieved by having the potential of the anode regions 18(1) and 18(2) greater than that of the cathode region 24 and forward-biasing the anode regions 18(1) and 18(2) with respect to the gate regions 20(1) and 20(2), respectively. Typically, 1–10 microamperes are pulled out of the gate regions 20(1) and 20(2) while the anode-gate junctions are forwardbiased to cause structure 10 to assume the on state.

It is possible to operate structure 10 in the on state with the potential of gate regions 20(1) and 20(2) at the same or a more positive level than that of anode regions 18(1) and 18(2), rspectively, cathode region 24, and region 22, so long as the potential of gate regions 20(1) and 20(2) is below a level which essentially completely depletes a vertical cross-sectional portion of semiconductor body 16 between anode regions 18(1) and 18(2) and cathode region 24. With the gate regions 20(1) and 20(2) held at such a potential level, the junction diodes comprising semiconductor body 16 and gate regions 20(1) and 20(2), respectively, have a zero forward bias or is reverse-biased.

Structure 10 of FIGS. 1 and 2 differs from conventional previous gated diode switch type structures in that the portions of the anode regions 18(1) and 18(2), gate regions 20(1) and 20(2), shield region 22, and cathode region 24 which essentially face each other are, instead of being rectangular, formed of portions of arcs of concentric circles having common center points A(1) and A(2), respectively. The arc lengths of the respective anodes are therefore smaller than the arc lengths of the respective gates, and the arc lengths of the gates are smaller than the arc lengths of the shield. The arc lengths of the shield are greater than that of the cathodes, since the shield surrounds the cathode. The number of degrees ($\phi$) of the arc lengths of the anodes, gates, and shield region is illustrated as approximately 90°, with the arc lengths of the cathodes being approximately 84°.

It has been found that in the conventional GDS, which uses parallel rectangular anode, gate, shield, and cathode regions, the efficiency of charge carrier emission at the cathode region is significantly lower than at the anode region. Even in the absence of a shield region, with rectangular p+ type anode and n− type gate and cathode regions and a p− type semiconductor body, the efficiency of carrier emission at the cathode region is lower than at the anode region. This limits the on resistance of the GDS. The radial structure of the present invention, as illustrated in FIGS. 1 and 2, effectively and significantly increases cathode charge carrier emission efficiency while only marginally decreasing anode charge carrier efficiency. The net result is that a GDS having a structure like structure 10 of FIG. 1 and 2 can be designed to have essentially the same distance between anode and cathode as a device with rectangular parallel anode and cathodes, but with a significantly lower on resistance.

It has been found that in many dual carrier injection structures that one of the injecting regions has a lower carrier injection efficiency than the other. One way of helping to equalize the two carrier injection efficiencies, and to achieve as high an injection efficiency for one region as the other, is to increase the perimeter of the portion of the less efficient charge carrier injection region versus the perimeter of the other region. The portions of the perimeters of the regions whose lengths must be adjusted are those who face each other. Various types of regular curves, such as ellipses, circles, parabolas, or other conic sections, can be used for the facing portions of the perimeters of the anode and cathode regions. Also, sine or cosine waves or sawtooth waveforms or other piecewise continuous curves can be used. The gate region can likewise be any of these curves. The shield region typically has the same type of curve as the cathode region. The anode, cathode, and gate regions can all have different curves.

Structure 10 of FIG. 1 is similar to structure 10 of FIG. 1 of U.S. patent application Ser. No. 448,631, filed Dec. 10, 1982, and having a common assignee and two common inventors, which has a single anode, single gate, and single cathode, as compared to the structure of the present invention which has dual anodes, dual gates, and dual cathodes. If the distances between the anodes(s), gate(s), shield, and cathode of the two structures are kept the same, then structure 10 of FIG. 1 of the present application will have approximately one-half or less of the on resistance and require 25 percent more silicon area as compared to structure 10 of the earlier patent application. Some applications require high operating voltages but lower on resistance than the RGDS of the earlier above-described patent application can provide. Structure 10 of the present invention can be designed to have the same operating voltage as the earlier RGDS, but has only approximately one-half or less of the on resistance. The only penalty is an approximate 25 percent increase in the area of silicon needed.

Structure 10 is designed to increase the total net efficiency of charge carrier emission from anode regions 18(1) and 18(2) and cathode region 24 so as to reduce the on resistance of structure 10. The choice of making the arc length of a side of cathode region 24 greater than that of the arc length of a side of anode regions 18(1) and 18(2) tends to increase the charge carrier injection efficiency of region 24 versus regions 18(1) and 18(2). For the embodiment fabricated, cathode region 24, even without the inclusion of shield region 22, typically has a lower charge carrier efficiency than anode regions 18(1) and 18(2). With the inclusion of shield region 24, the effective charge carrier efficiency of cathode region 22 is further reduced. The arc length of cathode region 24, being greater than anode regions 18(1) and 18(2), increases the charge carrier injection efficiency of cathode region 24 versus anode region 18. A reduction in the size of the arc portion of anodes 18(1) and 18(2) beyond a certain point can significantly reduce both charge carrier efficiency to a point that there can be a net loss in overall charge carrier efficiency. One desirable embodiment would use a cathode region having as long an arc length relative the arc length of anode regions 18(1) and 18(2), as is possible with a minimum arc length for anode regions 18(1) and 18(2) such that the overall net charge carrier efficiency of structure 10 is as high as is practically possible. This will result in helping to reduce on resistance. Structure 10 can be used as a type of bipolar transistor with regions 20(1) and 20(2) serving as the collector, region 24 serving as the emitter, and regions 18(1), 18(2), and 22 and semiconductor body 16 serving as the base. As long as the potential applied to the collector (regions 20(1) and 20(2)) is below the level which inhibits or interrupts current flow between regions 18(1) and 18(2) and 24 and the base (body 16 and region 22) is forward-biased with respect to the emitter (region 24), conduction between the collector (regions 20(1) and 20(2)) and the emitter (region 24) occurs. Base current which supports this conduction originates from base contact regions 18(1) and 18(2). If the collector voltage is increased to a level which is sufficient to cut off conduction between regions 18(1) and 18(2) and 24, then the base current from regions 18(1) and 18(2) is cut off and, consequently, conduction between the collector (regions 20(1) and 20(2)) and the emitter (region 24) is also cut off.

It has been discovered that decreasing the impurity concentration of the bulk portion of semiconductor body 16 of structure 10 of FIG. 1 causes a modification in the mode of operation. Starting with the above design parameters, but with the impurity concentration of the bulk of semiconductor body 16 at approximately $1 \times 10^{13}$ instead of $5-9 \times 10^{13}$ impurities/cm$^3$, it was found that with the potential of gate regions 20(1) and 20(2) at approximately the same level as anode regions 18(1) and 18(2), conduction between anode regions 18(1) and 18(2) and cathode region 24 is inhibited or interrupted (cut off) except for a relatively low level flow. This is the off (high impedance) state. With a positive bias applied to anode regions 18(1) and 18(2) relative to cathode region 24, and with gate regions 20(1) and 20(2) allowed to essentially electrically float in potential, substantial current flow can exist between anode regions 18(1) and 18(2) and cathode region 24. This is the on (low impedance) state. The relatively low level current flow of the off state helps in switching structure 10 to the on state. Control circuitry useful to control the state of a structure 10 which has the operating characteristics described in this paragraph is described in U.S. patent application Ser. No. 248,206, now abandoned, (A. R. Hartman-T. J. Riley-P. W. Shackle Case 27-20-32).

One major advantage of structure 10, which has a semiconductor body 16 whose impurity concentration is as described immediately hereinabove, is that the gate potential need only be at that of the anode potential to switch the structure to the off state. It is thus not necessary to use a higher potential than exists at the anode in order to operate structure 10. Many applications require high voltage and high current switches, but the most positive potential available is that applied to one of the terminals of the switch. This embodiment of structure 10 can be used in such applications so long as a limited amount of current flow can be tolerated between the anode and cathode regions when structure 10 is in the off state. It is, however, necessary to maintain fairly tight tolerances on the impurity concentration of semiconductor body 16 in order to operate structure 10 as indicated.

Figure 3:
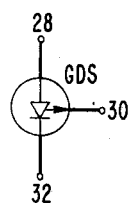
FIG. 3 illustrates an electrical circuit symbol for the structure of FIGS. 1 and 2.

An electrical symbol adopted for switch 10 of FIGS. 1 and 2 is illustrated in FIG. 3 and is denoted as a GDS. The anode, gate, and cathode electrodes of GDS are denoted as terminals 28, 30, and 32, respectively.

Figure 4:
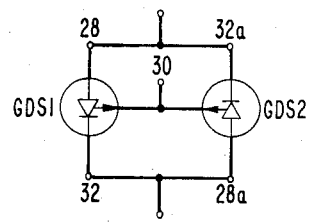
FIG. 4 illustrates an electrical circuit schematic of a bidirectional switch.

Referring now to FIG. 4, there is illustrated a bidirectional switch combination comprising two GDS's (GDS1 and GDS2) in accordance with the present invention, with electrode 28 (the anode electrode of GDS1) electrically coupled to electrode 32a (the cathode electrode of GDS2), the electrode 32 (the cathode electrode of GDS1) electrically coupled to electrode 28a (the anode electrode of GDS2). This switch combination is capable of conducting signals from electrodes 28 and 32a to electrodes 28a and 32 or vice versa. The bilateral blocking characteristic of structure 10 facilitates this bilateral switch combination. Two separate bodies 16 can be formed in a common support 12, and the appropriate electrical connections can be made to form the above-described bidirectional switch. A plurality of separate bodies 16 can be formed in a common support 12 to form an array of switches.

Figure 5:
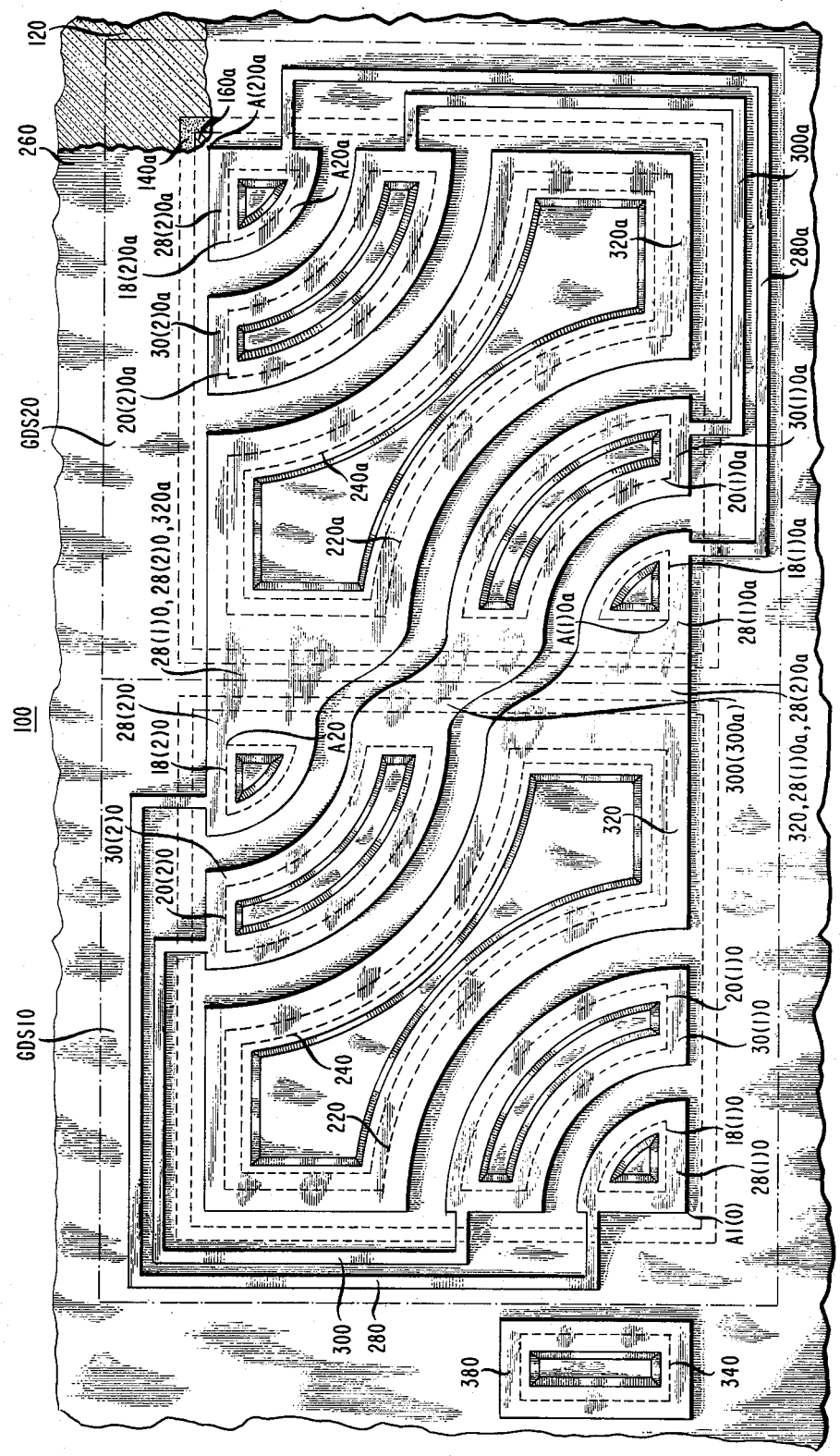
FIG. 5 illustrates a top view of a structure in accordance with another embodiment of the invention which has the equivalent electrical circuit schematic of FIG. 4.

Referring now to FIG. 5, there is illustrated a semiconductor structure 100 comprising two essentially identical gated diode switches GDS10 and GDS20 which are illustrated within dashed line rectangles and are both formed in a semiconductor wafer 120. Each of GDS10 and GDS20 is essentially identical in structure to structure 10 of FIGS. 1 and 2. GDS10 and GDS20 are electrically connnected together in the same way as are GDS1 and GSD2 of FIG. 4 and as such form a bidirectional switch. The regions and other components and metallization of GDS10 which correspond to those of structure 10 of FIGS. 1 and 2 have the same designation with an extra "0" added. The regions and other components and metallization of GDS20 which correspond to those of structure 10 of FIGS. 1 and 2 have the same designation with an "0a" added. A first common electrode 300 (300a) is connected to gate regions 20(1)0 and 20(2)0 of GDS 10 and to gate regions 20(1)0a and 20(2)0a of GDS10. A second common electrode 320, 28(1)0a, 28(2)0a is connected to anode region 180a and to cathode region 220. A third electrode 28(1)0, 28(2)0, 320a is connected to anode regions 18(1)0 and 18(2)0 and to cathode region 240a.

The embodiments described herein are intended to be illustrative of the general principles of the invention. Various modifications are possible consistent with the spirit of the invention. For example, for the designs described, support members 12 and 120 can alternatively be p type conductivity silicon, gallium arsenide, sapphire, a conductor, or an electrically inactive material. If support members 12 and 120 are electrically inactive materials, then dielectric layers 14, 140, and 140a can be eliminated. Still further, bodies 16, 160, and 160a can be fabricated as air isolated type structures. This allows for the elimination of support members 12 and 120 and dielectric layers 14, 140, and 140a. Further, the electrodes can be doped polysilicon, gold, titanium, or other types of conductors. Still further, the impurity concentration levels, spacings between different regions, and other dimensions of the regions can be adjusted to allow significantly different operating voltages and currents than are described. Additionally, other types of insulating (dielectric) materials, such as silicon nitride or Semi-Insulating Polycrystalline Oxygen Doped Silicon (SIPOS), can be substituted for silicon dioxide. Still further, the conductivity type of all regions within the dielectric layer can be reversed provided the voltage polarities are appropriately changed in the manner well known in the art. It is to be appreciated that two structures of the present invention with common gate terminals and the anode of each coupled to the cathode of the other allow alternating or direct current operation. Still further, a single semiconductor substrate can contain some semiconductor bodies which are of p− type conductivity and some which are of n− type conductivity. Still further, in some applications which do not require the breaking of current between anode and cathode, the gate region can be eliminated. Still further, the semiconductor bodies can be n− type conductivity, with the anode being p+ type conductivity and the cathode being n+ type conductivity, as is the case in pending U.S. patent application Ser. No. 284,207 now U.S. Pat. No. 4,587,656, filed Mar. 27, 1981 (A. R. Hartman-T. J. Riley-P. W. Shackle Case 28-21-33). Still further, the semiconductor bodies can be essentially intrinsic. Still further, the structure can be modified such that two RGDS's can be formed in a single semiconductor body as is taught in G. K. Chang-A. R. Hartman-H. T. Weston Case 2-33-1, Ser. No. 333,700 now U.S. Pat. No. 4,467,344, filed Dec. 23, 1981, and having a common assignee. Still further, a resistor can be coupled between the anode and shield regions, and the structure can be used as is described in U.S. patent application Ser. No. 333,461, now U.S. Pat. No. 4,608,590 (A. R. Hartman-T. J. Riley-P. W. Shackle Case 36-24-38), filed Dec. 22, 1981, in which there is a common assignee. Still further, the gate regions can be buried gates, as is taught in A. R. Hartman-A. U. MacRae-P. W. Shackle Case 32-23-37, Ser. No. 333,762, now U.S. Pat. No. 4,602,268 filed Dec. 23, 1981, in which there is a common assignee, or can be a remote gate as is taught in J. E. Berthold-A. R. Hartman-T. J. Riley-P. W. Shackle Case 4-30-22-35, Ser. No. 248,281, now U.S. Pat. No. 4,587,545 filed Mar. 27, 1981, in which there is a common assignee. Still further, the structure can be fabricated as a junction GDS as is taught in A. R. Hartman-B. T. Murphy-T. J. Riley-P. W. Shackle Case 26-22-19-31, Ser. No. 248,205, now U.S. Pat. No. 4,586,073 filed Mar. 27, 1981, in which there is a common assignee. Still further, the gate and shield regions of structures 10 and 100 can be eliminated, and the semiconductor body can be of p or n type conductivity or essentially intrinsic. Such a structure is essentially a p-i-n type diode, with the "i" being essentially instrinsic or of p or n type conductivity. Still further, in such a p-i-n structure, a shield region could be added to increase the operating voltage range. Still further, structures 10 and 100 can be used with a p+ type anode region, an n+ type cathode region, a p type shield region, and an n type semiconductor body, but without gate regions 20(1), 20(1)0, 20(1)0a, 20(2), 20(2)0, 20(2)0a, and 200 with separate electrodes connected to anode regions 18, 180, cathode regions 24, 240, and shield regions 22, 220. Such a device is essentially a thyristor. Still further, the arc portions of the anode and cathode regions which face each other need not be just portions of arcs of concentric circles; one or both can be parametric curves.

What is claimed is:

1. A semiconductor device structure located in a semiconductor body having a first major surface comprising:
   (a) a first high conductivity localized region of the body intersecting the first major surface at a first localized area thereof having a perimeter characterized essentially by a concavo-concave portion;
   (b) second and third high conductivity localized regions of the body intersecting the first major surface at second and third localized areas, respectively, the second and third areas each having a separate perimeter characterized essentially by convaco-convex portion, the convex portion of the perimeter of the second area being spaced apart from one of the concave portions of the perimeter of the first area essentially by a first fixed distance, the convex portion of the perimeter of the third area being spaced apart from the other of the concave portions of the perimeter of the first area essentially by the first fixed distance; and
   (c) fourth and fifth high conductivity localized regions of the body intersecting the first major surface at fourth and fifth localized areas, respectively, the fourth and fifth areas each having a separate perimeter characterized essentially by convex portion, the convex portion of the perimeter of the fourth area being spaced apart from the concave portion of the second area essentially by a second fixed distance, and the convex portion of the perimeter of the fifth area being spaced apart from the concave portion of the third area essentially by the second fixed distance, the sum of the lengths of the convex portions of the perimeters of the fourth and fifth areas being less than the sum of the lengths of the two concave portions of the perimeter of the first area,
   the first, second, and third regions all being essentially of one conductivity type, and the fourth and fifth regions both being essentially of conductivity type opposite to the one type and being coupled together by an electrical conductor.

2. The structure of claim 1 in which the one conductivity type is p-type and the opposite is n-type.

3. The structure of claim 2 in which the first, second, third, fourth, and fifth regions are essentially surrounded and mutually spaced apart and separated by a bulk region of the body having relatively low conductivity and having the one conductivity type.

4. A semiconductor device structure integrated in a semiconductor body, having a major surface and a relatively low conductivity bulk region, comprising:
(a) a first high conductivity localized region of first conductivity type in the body contiguous with the bulk region and intersecting the major surface at a first localized area thereof, the first area characterized by a perimeter which has a concavo-concave portion; and
(b) second and third mutually separated high conductivity localized regions, both of second, opposite conductivity type in the body, contiguous with the bulk region, and intersecting the major surface at second and third localized areas, respectively, the second area characterized by a perimeter which has a convex portion which is spaced apart from one of the concave portions of the perimeter of the first area essentially by a first fixed distance, and the third area characterized by a perimeter which has a convex portion that is spaced apart from the other of the concave portions of the perimeter of the first area essentially by the first fixed distance, the sum of the lengths of the convex portions of the perimeters of the second and third areas being less than the sum of the lengths of the two concave portions of the perimeter of the first area, the two concave portions of the perimeter of the first area being essentially circular arcs each having an arc length of approximately 90°, and the convex portions of the perimeter of the second and third areas being separate circular arcs that are concentric with the circular arcs respectively of the one and of the other of the two convave portions of the perimeters of the first area.

5. The structure of claim 4 in which the sum of the lengths of the convex portions of the perimeters of the second and third areas is sufficiently less than the sum of the lengths of the concave portions of the perimeter of the first area that the charge carrier injection efficiency of the second plus the third regions is substantially equal to the charge carrier injection efficiency of the first region during operation with applied voltage bias to the first, second, and third regions.

6. The structure of claim 4 further comprising
fourth and fifth high conductivity regions, each of the same conductivity type as the other, located in the body contiguous with the bulk region and intersecting the major surface at fourth and fifth localized areas, respectively, and intervening respectively between the first and second areas and between the first and third areas, the perimeters of the fourth and fifth areas each having a concavo-convex portion, the concave portion of the perimeter of the fourth and of the fifth area being spaced apart respectively from the convex portion of the perimeter of the second area and of the third area, respectively, essentially by a second, smaller fixed distance.

7. The structure of claim 6 in which the convex portion of the perimeter of the fourth and of the fifth area is spaced apart from the concave portion of the perimeter of the second and of the third area, respectively, essentially by a third fixed distance smaller than the first fixed distance.

8. The structure of claim 7 in which the conductivity type of the fourth and fifth regions is the first conductivity type.

9. The structure of claim 4 further comprising
fourth and fifth high conductivity regions, each of the same conductivity type as the other, located in the body contiguous with the bulk region and intersecting the major surface at fourth and fifth localized areas, respectively, and intervening respectively between the first and second areas and between the first and third areas, the perimeters of the fourth and fifth areas each having a concavo-convex portion, the convave portion of the perimeter of the fourth area and of the fifth area being spaced apart respectively from the convex portion of the perimeter of the second area and of the third area, respectively, by a second, smaller fixed distance.

10. The structure of claim 9 in which the convex portion of the perimeter of the fourth and of the fifth area is spaced apart from the concave portion of the perimeter of the second and of the third area, respectively, essentially by a third fixed distance smaller than the first fixed distance.

11. The structure of claim 10 in which the conductivity type of the fourth and fifth regions is the first conductivity type.

12. A semiconductor device structure having
(a) a concavo-concave central region of first conductivity type located in a semiconductor body and intersecting a major surface of the body at a first area having a perimeter largely comprising first and second opposed elongated concave perimeter portions both of which are concave receding inwards towards a central point located within said first area, said first and second elongated concave perimeter portions being separated from each other and located on opposite sides of said central point, whereby said first area has a concavo-concave configuration; and
(b) a pair of mutually separated convex regions of second conductivity type each located in the body and intersecting the major surface at a respective convex area each of which has a separate convex perimeter portion that is essentially everywhere spaced by a first fixed distance from a separate one of the concave perimeter portions of the central regions, whereby the length of each convex perimeter portion is less than the length of the concave perimeter portion from which it is spaced.

13. A semiconductor device structure having
(a) a concavo-concave central region of first conductivity type located in a semiconductor body and intersecting a major surface of the body at a first area having a perimeter largely comprising first and second opposed elongated perimeter portions both of which are concave receding inwards towards a central point located within said first area, said first and second elongated concave perimeter portions being separated from each other and located on opposite sides of said central point, whereby said first area has a concavo-concave configuration; and
(b) a pair of mutually separated convex regions of second conductivity type each located in the body and intersecting the major surface at a respective convex area each having a respective convex perimeter portion that is essentially everywhere spaced apart by a first fixed distance from a separate one of the concave perimeter portions of the central regions, and (c) a pair of high conductivity concavo-convex regions each located in the body and each intervening between the central region and a separate one of the pair of convex regions, each of the concavo-convex regions intersecting the major surface at a respective concavo-convex area each having a convex perimeter portion that is spaced by a second fixed distance a separate one of the concave perimeter portions of the central region and having a concave perimeter portion that is spaced by a third fixed distance from the convex perimeter portion of a separate one of the convex regions.

* * * * *

UNITED STATES PATENT AND TRADEMARK OFFICE
CERTIFICATE OF CORRECTION

PATENT NO. : 4,691,220

DATED : September 1, 1987

INVENTOR(S) : Hans W. Becke and Robert K. Smith

It is certified that error appears in the above-identified patent and that said Letters Patent is hereby corrected as shown below:

Column 12, line 58, after "elongated" insert --concave--.

Signed and Sealed this

Fifth Day of April, 1988

*Attest:*

DONALD J. QUIGG

*Attesting Officer*      *Commissioner of Patents and Trademarks*